United States Patent [19]
Colavin

[11] Patent Number: 5,636,142
[45] Date of Patent: Jun. 3, 1997

[54] DIGITAL PROCESSING CIRCUIT COMPRISING TEST REGISTERS

[75] Inventor: Oswald Colavin, Voreppe, France

[73] Assignee: SGS-Thomson Microelectronics S.A., Gentilly Cedex, France

[21] Appl. No.: 384,559

[22] Filed: Feb. 6, 1995

[30] Foreign Application Priority Data

Feb. 4, 1994 [FR] France .................. 94 01302

[51] Int. Cl.⁶ .................................. H04N 1/32
[52] U.S. Cl. .......................... 364/514 R; 348/721
[58] Field of Search ............... 364/514 R; 371/22.3; 341/65; 348/721, 568, 575; 370/60.1, 109; 395/114, 275, 478

[56] References Cited

U.S. PATENT DOCUMENTS 4,701,921  10/1987  Powell et al. .
4,991,019  2/1991  Enami et al. ................ 348/721
5,218,688  6/1993  Nishida ....................... 395/478
5,325,092  6/1994  Allen et al. .................. 341/65

*Primary Examiner*—Emanuel T. Voeltz
*Assistant Examiner*—Thomas Peeso
*Attorney, Agent, or Firm*—Robert Groover; Betty Formby

[57] ABSTRACT

The invention relates to a digital processing circuit comprising a host interface (7) which provides access from the processing circuit's bus (6) to an external data processing system (8). The processing circuit is broken down into blocks (1, 2, 3) with test registers (4, 5) interposed between an upstream block and a downstream block. The test registers (4, 5) are connected to the bus (6) and identified by an address allowing data to be sent to them or read from them.

25 Claims, 3 Drawing Sheets

DIGITAL PROCESSING CIRCUIT COMPRISING TEST REGISTERS

CROSS-REFERENCE TO RELATED APPLICATION

This application claims priority from French App'n 94 01302, filed Feb. 4, 1994. However, the content of the present application is not necessarily identical to that of the priority application.

Other aspects of the chip of the presently preferred embodiment are also described in copending U.S. patent application Ser. No. 08/384,560, filed simultaneously herewith, entitled "Shifter Stage for Variable-Length Digital Code Decoder," and claiming priority from French application 94/01301.

BACKGROUND AND SUMMARY OF THE INVENTION

This invention relates to a digital processing circuit comprising test registers.

It concerns more particularly a digital circuit having a host interface which provides access from the bus of said digital circuit to an external data processing system.

Test registers are widely used in digital processing circuits and allow the operation of the circuit, particularly that of certain blocks, to be checked during both development and production testing of said circuits.

Up to now, these circuits have only generally provided access to the circuit's operating data, and do not allow the circuits different registers to be individually accessed.

Moreover, these known test registers do not allow a given block to be supplied with predetermined data according to the testing required.

Techniques for transmitting and storing digitized pictures make it possible to significantly improve the quality of the final pictures obtained, as compared to analog transmission. The applications of these techniques can also therefore be multiplied.

However, direct transmission and storage of moving digitized pictures requires an extremely high bit rate which in practice calls for these pictures to be compressed and coded. The digitized pictures are therefore coded prior to transmission so as to reduce the amount of data that they represent, and decoded after transmission.

The coding and decoding techniques are of course crucial to the final picture quality obtained, and it became apparent that some standardization would be required to ensure compatibility between the different equipment using these techniques.

Accordingly, a group of experts (known as the Moving Picture Expert Group or "MPEG") drew up the ISO Standard 11172. This standard, often referred to as MPEG, defines coding and decoding conditions of moving pictures, possibly associated with a sound signal, which can be used for storing and recalling pictures from memory and transmitting them.

This MPEG standard can be used to store pictures on compact discs, interactive compact discs, magnetic tapes, and to transmit pictures over local area networks and telephone lines as well as to transmit TV pictures through the air. For a full, detailed description of the entire technique, the reader is invited to read the MPEG standards which are referenced below.

Compressing data according to the MPEG standard may follow several different procedures. Consecutive pictures are collected making up a group of images forming a sequence. A sequence is therefore subdivided into groups of images. Each image is divided into sections and each section is broken down into macro-blocks which constitute the base element used to apply movement compensation and to change, where necessary, the quantization scale.

The macro-blocks are formed from a 16×16 matrix of picture elements (pixels). Each macro-block is divided into six blocks, the first four blocks carrying a brightness signal, and the other two blocks a chrominance signal, respectively blue and red. Each of these six blocks is defined as an 8×8 matrix of picture elements (pixels). Given the analogies existing between the information contained in the different images in a given sequence and in order to reduce the quantity of information stored or transmitted, different types of image are defined within each sequence.

I pictures (Intra frames) are pictures which are coded as a still image and therefore without reference to another image.

P images (Predicted) are deduced starting from the I or P image previously reconstructed.

B images (Bi-directional frames) are deduced from two reconstructed images, one I and one P or two P, one just before and the other just after.

It should be stressed that the images in a sequence are transmitted in the order of decoding and not generally in the order in which they are presented at the time of acquisition or restitution.

The Discrete Cosine Transformation (DCT) is applied on the block level. This DCT transformation transforms the spatial blocks, defined as indicated above as an 8×8 matrix of pixels, into temporal blocks formed also as an 8×8 matrix, of spatial frequencies.

It has been found that in the 8×8 matrix of the temporal block, the continuous background coefficient (DC) placed in the upper left hand corner of the matrix is much more important in terms of the visual impression obtained than the other components corresponding to different frequencies.

More precisely, the higher the frequency, the less sensitive the eye is to it. This is why the levels of frequencies are quantized, especially since the frequencies are high. This quantization is ensured by an algorithm that is not imposed by the standard, and which could be a quantization and variable length coding (VLC) operation.

The matrix in the frequency domain obtained by the DCT transformation is next processed by a matrix called "quantization matrix" which is used to divide each of the terms of the matrix of the temporal domain by a value that is linked to its position, and which takes account of the fact that the weight of the different frequencies presented by these coefficients is variable.

After each value has been rounded to the closest integer value, this operation results in a large number of coefficients equal to zero.

It should be stressed that for the intra macro-blocks, the quantization value of the DC coefficient is constant, for example 8. The non-zero frequency coefficients are then coded according to zigzag type scanning with reference to a Huffman table, which gives a variable-length coded value to each of the coefficients of the matrix and reduces the volume. Preferably, the coefficients representing the continuous backgrounds are transmitted after quantization and, in addition, the quantization matrix is optimized, in such a way that the volume of data is under a predetermined level which corresponds to the maximum storage or transmission possibilities, without any serious reduction in the quality of information transmitted.

Type I frames are coded without use of the movement vector. Conversely, P and B frames use movement vectors, at least for certain macro-blocks which make up these frames, allowing coding efficiency to be increased and indicating from which part of the reference image(s) a particular macro-block of the considered frame must be deduced.

The search for the movement vector is the object of optimization at the time of coding, and the movement vector is itself coded by using the DPCM technique, which best exploits the existing correlation between the movement vectors of the different macro-blocks of a given image. They are finally the object of variable-length coding (VLC).

All the data concerning a coded sequence form the bit stream that is either recorded or transmitted. Such a bit stream begins with a sequence header containing a certain amount of information and parameters whose values are maintained throughout the sequence.

Likewise, the sequence is broken down into groups of frames, each of these groups is preceded by a group header and the data representing each frame are themselves preceded by a frame header.

The implementation of test registers is particularly important in complex circuits such as those used to decode bit streams for the reconstruction of pictures of the kind envisaged by the MPEG standard.

A first object of the invention is to allow a block to be tested inside a digital processing circuit by choosing the input data and examining the output data from this block.

Another object of this invention is to allow tests to be conducted using registers which can be transparent when the system is in use.

A further object of the invention is to allow test registers to be used within the context of the development of MPEG decoding circuits allowing setting of parameters representative of the operating environment of the system, such as size and other representative parameters of an image.

The invention concerns a digital processing circuit containing a host interface providing access from its bus to an external data processing system, said processing circuit being broken down into blocks, and having test registers interposed between an upstream block and downstream block.

According to the invention, the test registers are connected to the bus and identified by an address allowing data to be sent to them or read from them.

In different preferred embodiments, the device of the invention comprises the following characteristics taken in any technically feasible combination:

each register has an active state, when the register will detect orders from the bus, and a rest state, when it will not, said bus comprising control lines, an address line and data lines, the test registers comprising means for generating write signals according to the signals present on these lines making it pass to the active state, and additional means authorizing this write or read operation;

the test registers are transparent in the rest state;

it comprises a first multiplexer commanded by the write signal, receiving on one of its inputs the data flowing across the bus, the output of said multiplexer being connected to a second multiplexer commanded by the output of a logic operator which receives on input the write signal and a write enable signal, the second input of said second multiplexer being connected to the upstream block and the output of said second multiplier to the downstream block in the rest state, the test registers behave like a D-type flip-flop; each test register comprises a D-type flip-flop placed between the blocks, said blocks being separated by the register when it is in the rest state;

it allows operating tests to be conducted on a block n at nominal speed, the input test vector being written into the upstream register on the positive-going transition of a first clock pulse, the downstream register being read on the positive-going transition of a second clock pulse immediately following the first;

before the start of a read or write cycle, the impedance of the data bus is high;

it is included in a unit for decoding a bit stream representing pictures complying with the MPEG Standard;

a given test register can maintain the active state indefinitely, with access to the other test registers still being authorized;

at least one test register contains the information of its own state (active or at rest);

a test register can be activated by a program in the application environment, while all the other blocks in the circuit that are not concerned continue to behave normally.

BRIEF DESCRIPTION OF THE DRAWING

The disclosed inventions will be described with reference to the accompanying drawings, which show important sample embodiments of the invention and which are incorporated in the specification hereof by reference, wherein.

The invention will be better understood from the following detailed description with reference to the attached drawings. In these drawings.

DETAILED DESCRIPTION OF THE PREFERRED EMBODIMENTS

Figure 1:
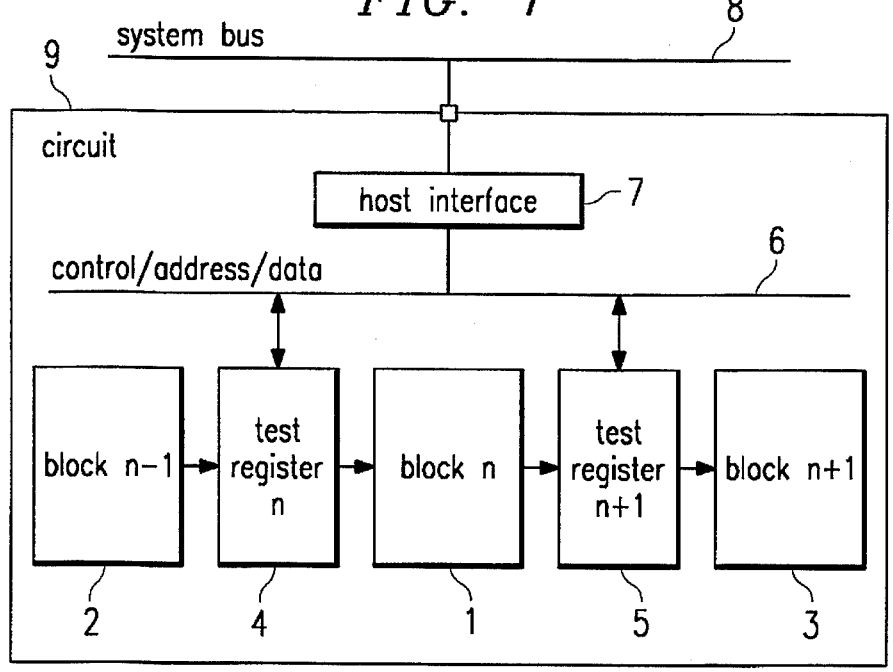
FIG. 1 is an overall block diagram of a digital processing circuit according to the invention.

The numerous innovative teachings of the present application will be described with particular reference to the presently preferred embodiment (by way of example, and not of limitation), in which:

The digital processing circuit 9, shown in FIG. 1, is broken down into a functional block 1 preceded by an upstream functional block 2 and followed by a downstream functional block 3. A test register n, also called upstream register, is placed between the upstream block 2 and the tested block 1, a n+1 register 5, also called downstream register, being placed between the tested block 1 and downstream block 3.

The bus 6 has a host interface 7 which allows an external data processing system, represented by its data bus 8, to send and receive data across bus 6.

Bus 6 comprises the customary control lines 61, address lines 62, and data lines 63.

Figure 2:
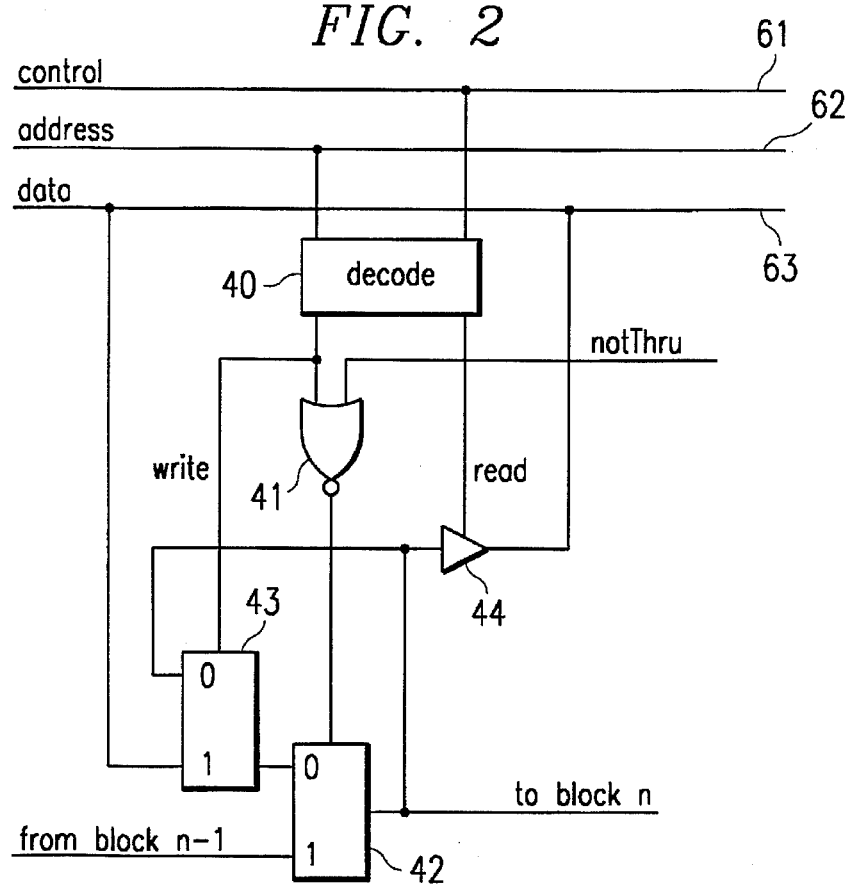
FIG. 2 is a block diagram of a first embodiment of the invention.

As shown in FIG. 2, each test register 4, 5 comprises a decoding unit 40 whose inputs are connected to control lines 61 and address lines 62, and which sends a write signal or a read signal depending on the signals received on said lines. A logic operator 41 receives, on one input, the write signal and, on its other input, a command signal originating either from a test control register, or from the register itself under test and enabling a write operation. The output from this logic operator 41 is connected to the command gate of a second multiplexer 42.

In the case of an upstream register test, this second multiplexer 42 receives on its input the data originating from the upstream block, its output being connected to the data input of the block to test 1. Of course if it constitutes a downstream register, multiplexer 42 receives on one of its inputs the data originating from the block to be tested, its output being connected to the data input of the downstream block.

A first multiplexer 43 receives on one of its inputs the data originating from data line 63 of bus 6, its other input being connected to the output signal from the second multiplexer 42. This output signal is also connected to data line 63 of bus 6 via gate 44 triggered by the read signal sent by decoder 40.

This first description corresponds exactly to a first embodiment.

Figure 3:
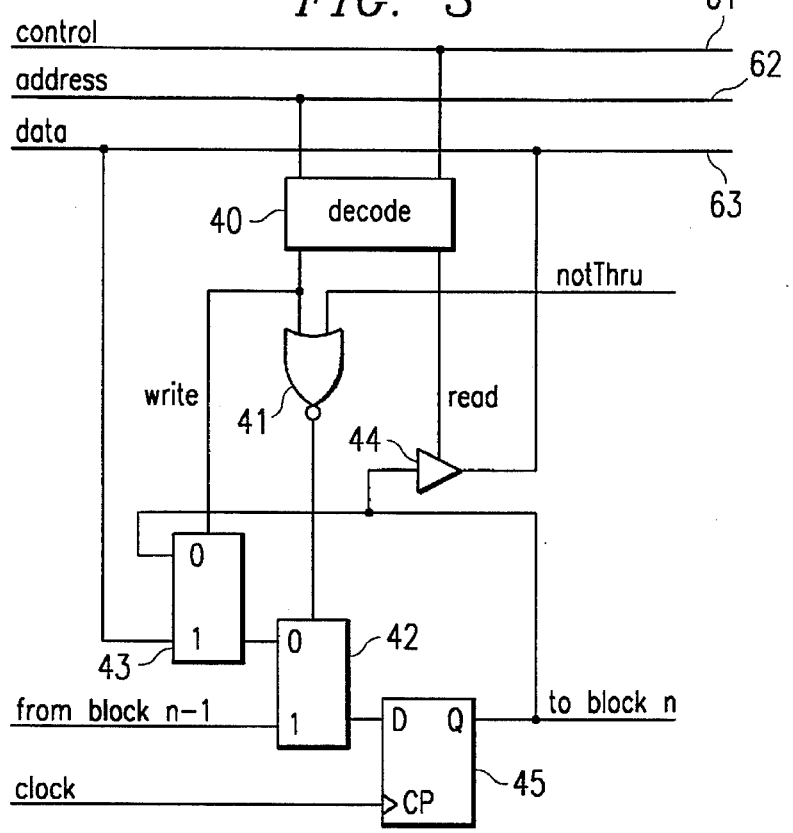
FIG. 3 is a block diagram of a second embodiment of the invention.

According to a second embodiment, shown in FIG. 3, a D-type flip flop 45 is interposed between the second multiplexer 42 and the output of the test register communicating the data to the block that follows it. In this last case, gate 44 is also connected to the output of flip-flop 45.

The control and address signals flowing on bus 6 can thus produce write and read operations in the register.

Figure 4:
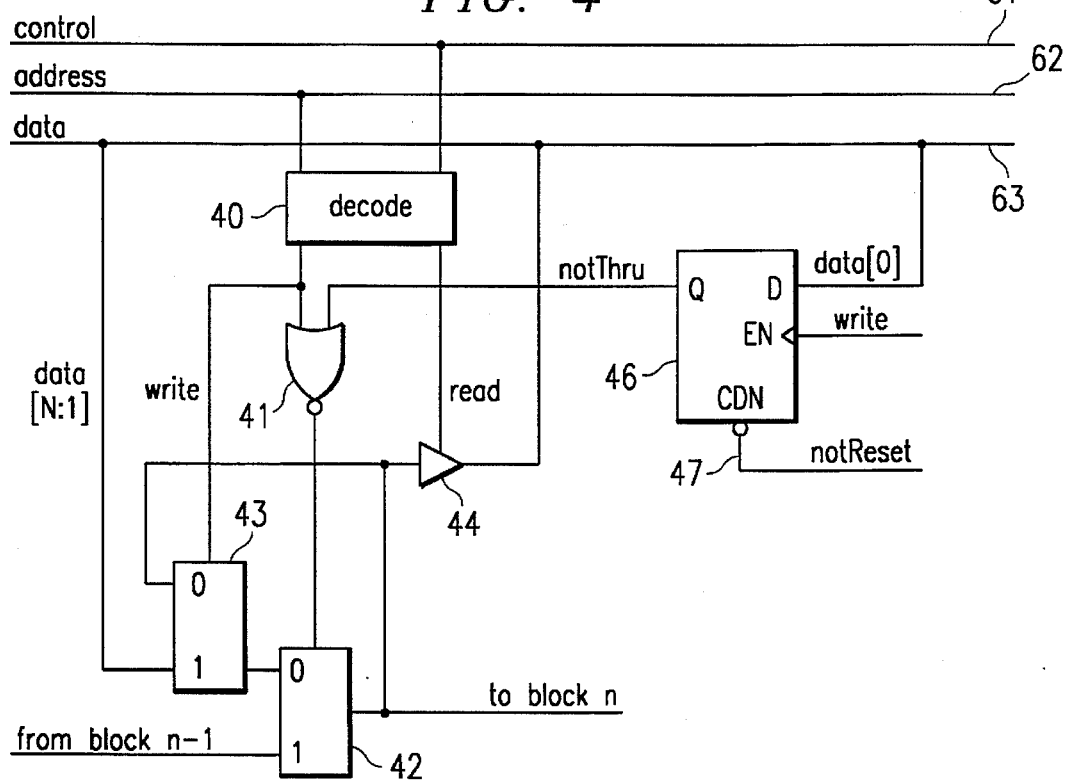
FIG. 4 is a block diagram of a third embodiment of the invention.

A register (4, 5) can maintain the active state indefinitely, still without preventing access to the other test registers. According to the third embodiment shown in FIG. 4, said register advantageously contains the information concerning its state (active or at rest) in, for example, a latching register 46, and can be activated by a program originating from the external data processing system, i.e. from the application environment, without this affecting the behavior of the other blocks in the circuit.

Latching register 46 maintains the information concerning the state of the register (4, 5) and is connected to one of the inputs of logic operator 41 and to data line 63. It comprises a reset input 47 which resets the register by means of the circuit's general reset signal.

In addition, the register can be made transparent by a control signal that can be stored in a special register.

Figure 5:
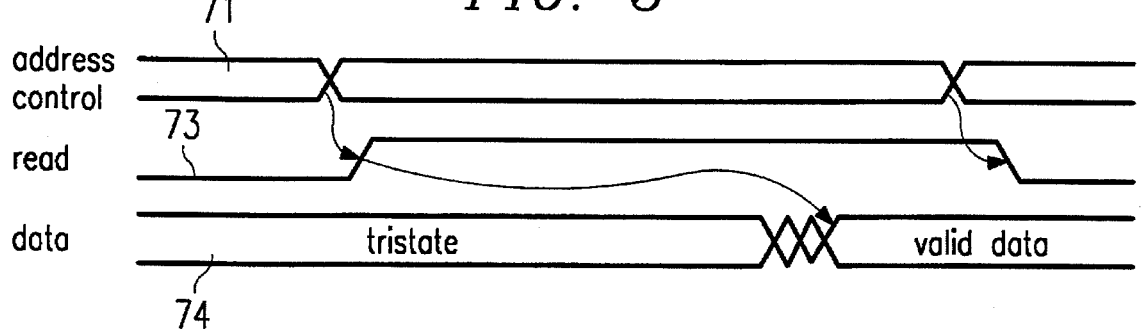
FIG. 5 is a timing diagram of read operations in the second embodiment of the invention.
Figure 6:
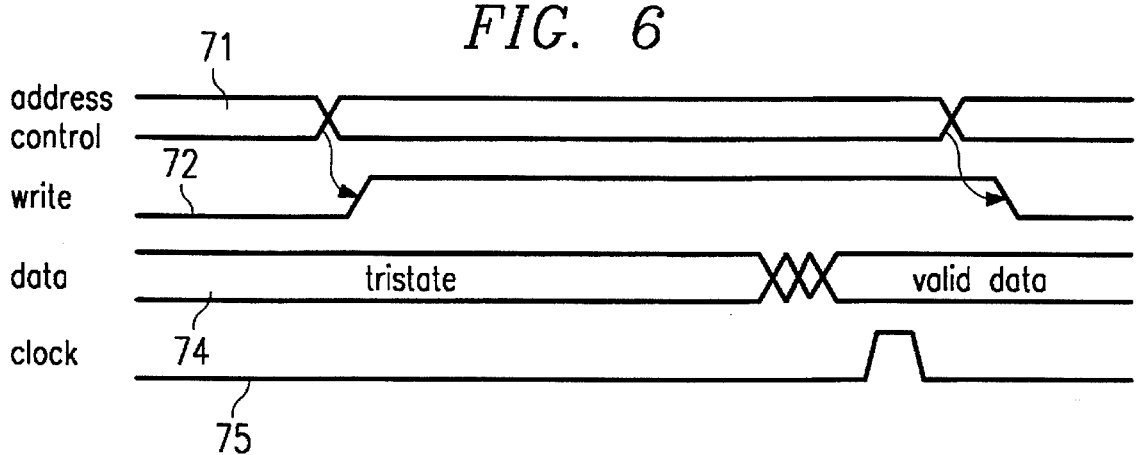
FIG. 6 is a timing diagram of write operations in the second embodiment of the invention.
Figure 7:
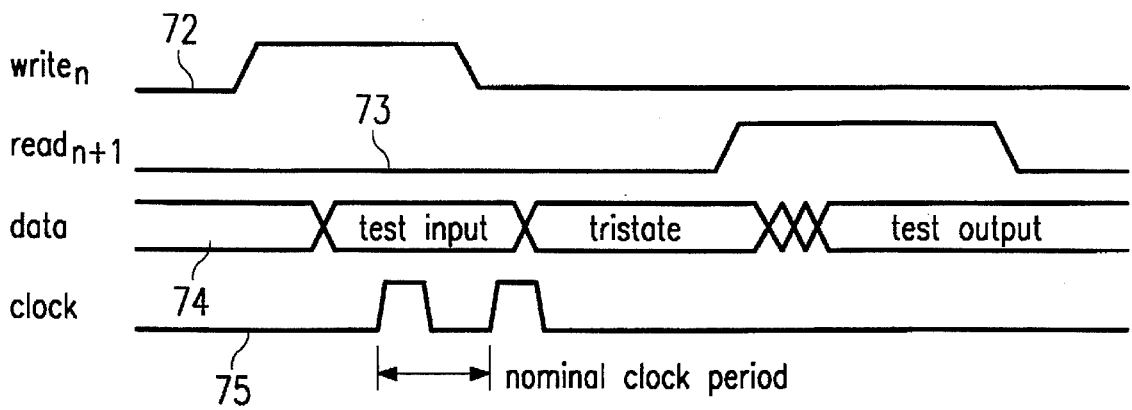
FIG. 7 is a timing diagram of write and read operations of input and output data for a given block according to the second embodiment of the invention.

In the read and write timing diagrams shown in FIGS. 5 to 7, the address signals are referenced 71, the write and read command signals 72 and 73 respectively, the data signals 74, and the clock signal 75.

Referring more particularly to the second embodiment, the working of the tests is as follows:

when the decoding of the address and control fields on the bus 6 generates a write command, the data is recognized and duly acquired by the register.

The read cycle is also followed in the same way when the test is conducted in compliance with the first embodiment of the invention.

The write cycle commences when the decoding of the address and control fields on the internal bus generates a write pulse. For the transparent test register, corresponding to the first embodiment, the data is sampled when the write command falls. For the test register with a D-type flip-flop, the data is sampled on each positive-going transition of the clock pulses when so authorized by the write signal.

The second type of register known as "flip-flop" allows tests to be conducted at nominal speed.

To achieve this, the data corresponding to the input test are written into the upstream register and after two positive-going transitions of clock pulses have occurred, the output test is read from the downstream register.

The first positive-going transition allows sampling of the data value for the input test, and the second positive going transition the same sampling for the output data from the downstream test register.

The command of the read and write signals for each test register with the aid of the external data processing system 8 via the host interface 7 makes it possible to rapidly and fully test each of the digital circuit blocks to be tested.

Note that the more complex the circuit, the greater the value of rapid testing.

Thus the invention, whatever its embodiment, makes it possible to access independently to the different test registers included in the circuit or in all the circuits connected to the same bus. Each register makes it possible to get the information concerning the output state of the upstream block and to select the input state of the downstream block.

A unique writing step can be proceeded for writing an information in a test register and, if needed, to latch this register.

It is possible to write a new information in a test register even when it is latched.

When a register is latched, it keeps its value even when the clock is activated and the circuit working.

The access to the test registers, as well for writing or for reading, is independent of the work of the circuit and therefore of the functional clock.

Each test register can be latched or unlatched independently.

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

What is claimed is:

1. Digital processing circuit comprising:
   a host interface providing access from its bus to an external data processing system;
   said bus comprising control lines, address lines and data lines;
   said processing circuit being broken down into blocks and having test registers interposed between an upstream block and a downstream block;
   wherein each said test register is connected to said lines of the bus, is identified by an address allowing data to be sent to is or the data that it contains to be read, and has an active state, in which it detects transfer orders from the bus, and a rest state, in which it does not;
   each test register comprising means allowing the generation of read or write signals according to the signals present on said lines of the bus making said test registers pass to the active state, and additional means authorizing this write or read operation.

2. The digital processing circuit of claim 1, wherein the test registers are transparent in the rest state.

3. The digital processing circuit of claim 1, wherein it comprises:
a first multiplexer commanded by the write signal, one input of which receives the data flowing across the bus, the output of said first multiplexer being connected to a second multiplexer commanded by the output of a logic operator,
said logic operator receiving on input the write signal and a write authorization signal,
the second input of said second multiplexer being connected to the upstream block and the output of said second multiplexer to the downstream block.

4. The digital processing circuit of claim 1, wherein in the rest state, the test registers behave like a D-type flip-flop.

5. The digital processing circuit of claim 4, wherein each test register comprises a D-type flip-flop placed between the blocks, said blocks being separated by the register when it is in the rest state.

6. The digital processing circuit of claim 5, wherein it allows operating tests to be conducted on a block n at nominal speed, the input test being written into the upstream register on the positive-going transition of a first clock pulse and read from the downstream register on the positive going transition of a second clock pulse immediately following the first.

7. The digital processing circuit of claim 1, wherein the impedance of the data bus is high before the start of a read or write cycle.

8. The digital processing circuit of claim 1, wherein it is included in a unit for decoding a bit stream representing pictures complying with the MPEG Standard.

9. The digital processing circuit of claim 1, wherein a given test register can maintain the active state indefinitely, while at the same time authorizing access to the other test registers.

10. The digital processing circuit of claim 1, wherein at least one test register contains its own state information (active or at rest).

11. The digital processing circuit of claims 1, wherein a test register can be activated by a program in the application environment, while all the other blocks in the circuit that are not concerned continue to behave normally.

12. A video image processing circuit comprising:
a data bus;
a host interface for connecting said digital processing circuit to an external system bus, said interface connected to said data bus;
a first video processing block having an input and an output;
a test register comprising:
a decoding circuit directly connected to said data bus to monitor and decode the contents of said data bus;
a logic circuit connected to said decoding circuit;
a first multiplexer having a first and second input, a control line connected to said decoding circuit, and an output, said second input connected to said data bus;
a second multiplexer having a first input connected to said output of said first multiplexer, a second input connected to said output of said first processing block, a control line connected to said logic circuit, and an output connected to said first input of said first multiplexer; and
a gate having an input connected to said output of said second multiplexer, an output connected to said data bus, and a control line connected to said decoding circuit.

13. A circuit according to claim 12, said test register further comprising a flip-flop having an input connected to said output of said second multiplexer, an output connected to said input of said gate and to said first input of said first multiplexer, and a control input for controlling when the contents of said input are passed to said output.

14. A circuit according to claim 12, said test register further comprising a latching flip-flop for latching the value at said output of said second multiplexer, having an input connected to said data bus, an output connected to said logic circuit, a control input for controlling when the contents of said input are passed to said output, and a reset input for resetting the value of said flip-flop.

15. A circuit according to claim 12 wherein said decoding circuit has a specific address passed in an address portion of said contents of said data bus.

16. A circuit according to claim 12, wherein said test register has a passive state in which said output of said first processing block is passed to said output of said second multiplexer.

17. A video image processing circuit comprising:
a first bus comprising a control line, an address line and a data line;
a host interface for connecting said digital processing circuit to an external system bus, said interface connected to said data bus;
a plurality of video processing blocks each having an image data input and an image data output;
a plurality of test registers, each connected to said data bus, each of said test registers having a data input and a data output, said data input of each of said test registers connected to said output of an upstream one of said processing blocks, said data output of each of said test registers connected to said input of a downstream one of said processing blocks
wherein each of said test registers is connected to said control line, said address line and said data line of said first bus.

18. A video image processing circuit according to claim 17, wherein any ones of said test registers may be controlled independently of any other ones.

19. A video image processing circuit comprising:
a data bus;
a host interface for connecting said digital processing circuit to an external system bus, said interface connected to said data bus;
a first processing block having an input and an output;
a first test register comprising:
a decoding circuit directly connected to said data bus to monitor and decode the contents of said data bus;
a logic circuit connected to said decoding circuit;
a first multiplexer having a first and second input, a control line connected to said decoding circuit, and an output, said second input connected to said data bus;
a second multiplexer having a first input connected to said output of said first multiplexer, a second input, a control line connected to said logic circuit, and an output connected to said first input of said first multiplexer and to said input of said processing block; and a gate having an input connected to said output of said second multiplexer, an output connected to said data bus, and a control line connected to said decoding circuit a second test register comprising:
  a decoding circuit directly connected to said data bus to monitor and decode the contents of said data bus;
  a logic circuit connected to said decoding circuit;
  a first multiplexer having a first and second input, a control line connected to said decoding circuit, and an output, said second input connected to said data bus;
a second multiplexer having a first input connected to said output of said first multiplexer, a second input connected to said output of said first processing block, a control line connected to said logic circuit, and an output connected to said first input of said first multiplexer; and
a gate having an input connected to said output of said second multiplexer, an output connected to said data bus, and a control line connected to said decoding circuit.

20. A video image processing circuit according to claim 19, wherein said first test register is used to write a test data from said data bus to said processing block, and said second test register is used to read a corresponding output data from said processing block and to place said output data on said data bus.

21. A method for testing a video processing block using a testing circuit having an input and an output, wherein said testing circuit is not a video processing block, comprising the steps of:

connecting an output of a processing block to an input of a first testing circuit;

accepting and decoding data from a data bus to determine the function desired to be performed by said testing circuit; and
  if a write operation is desired, passing a part of said data to on output of said testing circuit;
  if a read operation is desired, passing an input data from said input to said data bus and to said output;
  if a passive state is desired, passing all values at said input directly to said output.

22. A method according to claim 21, further comprising the step of when a read or write operation is being performed, storing the current value of said output within said testing circuit for a nominal time.

23. A method according to claim 21, further comprising the step of when said output of said testing circuit is desired to be latched, storing the current value of said output within said testing circuit for a nominal time.

24. A method according to claim 21, wherein an output of an upstream testing circuit, identical to said first testing circuit, is connected to an input of said processing block.

25. A method according to claim 24, further comprising the steps of performing a write operation using said upstream testing circuit to pass a given data to said input of said processing block, and performing a read operation using said first testing circuit to read the corresponding output of said processing block.

* * * * *